(12) United States Patent
Kaplan (10) Patent No.: US 10,521,520 B2
(45) Date of Patent: Dec. 31, 2019

(54) HIGHLY SCALABLE CLUSTER ENGINE FOR HOSTING SIMULATIONS OF OBJECTS INTERACTING WITHIN A SPACE

(71) Applicant: Nocturnal Innovations LLC, Hawthorne, NJ (US)

(72) Inventor: David Todd Kaplan, Hawthorne, NJ (US)

(*) Notice: Subject to any disclaimer, the term of this patent is extended or adjusted under 35 U.S.C. 154(b) by 1227 days.

(21) Appl. No.: 14/180,568

(22) Filed: Feb. 14, 2014

(65) Prior Publication Data

US 2014/0228115 A1    Aug. 14, 2014

Related U.S. Application Data

(60) Provisional application No. 61/764,673, filed on Feb. 14, 2013.

(51) Int. Cl.
  *G06F 17/50*   (2006.01)
  *A63F 13/30*   (2014.01)

(52) U.S. Cl.
  CPC .......... *G06F 17/5009* (2013.01); *A63F 13/12* (2013.01); *G06F 17/5095* (2013.01); *A63F 2300/513* (2013.01)

(58) Field of Classification Search
  CPC ........ A63F 13/12; A63F 13/56; A63F 13/577; A63F 13/352; A61B 5/744; G06N 3/006;
  (Continued)

(56) References Cited

U.S. PATENT DOCUMENTS 5,056,031 A * 10/1991 Nakano .................. B25J 9/1676
                                                         700/178
5,926,179 A *  7/1999 Matsuda ................... G06F 3/14
                                                         345/419

(Continued)

OTHER PUBLICATIONS

Palmer, Ian J., and Richard L. Grimsdale. "Collision detection for animation using sphere-trees." Computer Graphics Forum. vol. 14. No. 2. Edinburgh, UK: Blackwell Science Ltd, 1995. (Year: 1995).*

(Continued)

*Primary Examiner* — Omar F Fernandez Rivas
*Assistant Examiner* — Joshua E. Jensen (57) ABSTRACT

A highly scalable cluster of computing nodes simulates large numbers of objects interacting in a space defined by an octree of cubical elements. Each cube of the octree is enclosed within a corresponding padding sphere. Interacting objects are quickly identified by determining which of the padding spheres are candidate spheres that satisfy an interaction criterion, considering candidate objects located in the cubes that correspond to the candidate spheres, and determining which of the candidate objects meet the interaction criterion. The computing workload can be efficiently parallelized among nodes of the cluster by assigning the objects to the nodes in approximately equal numbers, each node being responsible for managing the objects assigned thereto. Inter-node data traffic can be minimized by reassigning frequently interacting objects to the same node. The cluster can be scaled simply by adding more nodes to the cluster, and redistributing the objects equally among the nodes.

18 Claims, 8 Drawing Sheets

(58) Field of Classification Search
CPC ... G06T 17/00; G06T 17/005; G06F 17/5009;
G06F 17/30327; G06F 17/5095
See application file for complete search history.

(56) References Cited

U.S. PATENT DOCUMENTS

| | | | | |
|---|---|---|---|---|
| 5,943,056 | A * | 8/1999 | Sato | G06T 17/00 345/419 |
| 6,587,110 | B1 * | 7/2003 | Kunimatsu | G06T 17/00 345/419 |
| 6,672,961 | B1 * | 1/2004 | Uzun | A63F 13/12 463/31 |
| 7,439,970 | B1 * | 10/2008 | Clarke | G06T 15/10 345/419 |
| 8,544,018 | B2 * | 9/2013 | Gobara | H04L 67/1008 709/223 |
| 8,612,196 | B2 * | 12/2013 | Rosedale | G06F 17/5009 345/419 |
| 8,643,719 | B2 * | 2/2014 | Vian | G07C 5/008 348/143 |
| 9,058,678 | B1 * | 6/2015 | Le Grand | G06T 15/005 |
| 9,721,380 | B2 * | 8/2017 | Schoenberg | G06T 15/40 |
| 2002/0118186 | A1 * | 8/2002 | Matsuda | A63F 13/12 345/419 |
| 2003/0114226 | A1 * | 6/2003 | Kimura | A63F 13/35 463/42 |
| 2003/0177187 | A1 * | 9/2003 | Levine | A63F 13/10 709/205 |
| 2003/0195735 | A1 * | 10/2003 | Rosedale | G06F 17/5009 703/13 |
| 2006/0031578 | A1 * | 2/2006 | Pelletier | A63F 13/352 709/245 |
| 2007/0041336 | A1 * | 2/2007 | Wan | H04L 29/12009 370/256 |
| 2008/0143721 | A1 * | 6/2008 | Liou | G06T 11/001 345/426 |
| 2009/0203449 | A1 * | 8/2009 | Douceur | A63F 13/10 463/42 |
| 2009/0213113 | A1 * | 8/2009 | Sim | G06T 17/005 345/419 |
| 2009/0292513 | A1 * | 11/2009 | Watte | A63F 13/12 703/6 |
| 2010/0113159 | A1 * | 5/2010 | Chapman | A63F 3/04 463/42 |
| 2010/0289804 | A1 * | 11/2010 | Jackman | G06F 9/547 345/520 |
| 2012/0079121 | A1 * | 3/2012 | Rapo | H04L 67/38 709/227 |
| 2014/0228115 | A1 * | 8/2014 | Kaplan | G06F 17/5009 463/31 |
| 2014/0324914 | A1 * | 10/2014 | Luo | G06T 17/005 707/797 |
| 2015/0279085 | A1 * | 10/2015 | Dell | G06T 15/10 345/419 |
| 2015/0294500 | A1 * | 10/2015 | Tucker | G05B 19/19 700/160 |

OTHER PUBLICATIONS

Anteru, "Loose Octrees", Nov. 14, 2008, [online] [retrieved on Feb. 14, 2014] Retrieved from the internet <URL: https://anteru.net/2008/11/14/315/>, 3 pages.

Bradshaw, Gareth, "Sphere-Tree Construction Toolkit", Feb. 12, 2003, [online] [retrieved on Feb. 14, 2014] Retrieved from the internet , <URL: http://isg.cs.tcd.ie/spheretree/>, 8 pages.

* cited by examiner

HIGHLY SCALABLE CLUSTER ENGINE FOR HOSTING SIMULATIONS OF OBJECTS INTERACTING WITHIN A SPACE

RELATED APPLICATIONS

This application claims the benefit of U.S. Provisional Application No. 61/764,673, filed Feb. 14, 2013, which is herein incorporated by reference in its entirety for all purposes.

FIELD OF THE INVENTION

The invention relates to computer simulations, and more particularly, to cluster engines that host multi-player games or other simulations of objects interacting in a space.

BACKGROUND OF THE INVENTION

Simulation of objects interacting in a space has become a vital tool for many areas of engineering and scientific investigation, as well as for single and multi-player game simulations. Scientists for example can use computer simulations to calculate and predict the motions and interactions of asteroids, comets, and other planetary bodies. Other scientific applications include such diverse areas as plasma physics, suspension flows, vortex simulations, porous media, and materials science.

In addition, simulation of objects interacting in space lies at the heart of many computer-enabled games, including so-called "Massively Multi-player Online Games" or "MMOG's."

As scientists and engineers seek to analyze ever more complex problems, and as more and more gamers wish to participate simultaneously in MMOG's, many of these technical and gaming applications face the problem of how to provide larger and larger simulations, while maintaining the simulation speed (in some cases real-time) and also minimizing the cost of the engine. Also, there is frequently a problem of scalability. At some point after a given system has been designed and implemented, it is not uncommon for users to wish to expand the capabilities of the system, so as to accommodate more objects and users, and/or more complex simulations, than were originally anticipated.

There is also a rising demand, especially in gaming applications, for better and better graphics, and also for options to participate using devices other than conventional personal computers, for example by using a tablet, a smart phone, or some other hand-held device with limited processing capacity.

One approach to providing larger and faster simulations is to use a single, high-end, dedicated server with very high speed and capacity. However, these so-called "super-computers" can be prohibitively expensive, and they can be difficult to scale beyond certain manufacturer-specified limits.

Another approach, used for example in some online environments, is to distribute most or all of the computation among the personal computers that are used by gamers to access the game. However, for this approach the required data traffic between the nodes increases rapidly as the number of nodes increases, effectively setting an upper limit on the number of players that can be accommodated simultaneously. Also, the computing speeds of the player nodes may vary, such that slower nodes may reduce the speed of the simulation and/or introduce latency effects. In addition, this approach excludes access to the MMOG environment using smart phones, tablets, and other web access devices that have relatively low on-board computing power. And also, this type of architecture can consume significant amounts of computing resources on the user computers during a game, which can limit the ability of the user computers to perform other tasks simultaneously, such as rendering graphics in support of the game. Also, users are often separated from each other by large distances, so that the internet latencies resulting from this type of distributed computing can rise to unacceptable levels.

Yet another approach is to use a cluster of smaller computers, such as a "Beowulf" cluster, as the simulation engine. A Beowulf cluster is a cluster of typically identical, commodity-grade computers that are connected into a small local-area network, having libraries and programs installed which allow processing to be shared among them. The result can be a high-performance, parallel computing cluster assembled from inexpensive personal computer hardware.

Of course, for a cluster of commodity-grade computers to serve as a simulation engine, the computing load must be parallelized, so that it can be distributed among the nodes of the cluster. One approach is to assign specific types of tasks to each node. For example, one node might keep track of the identities and descriptive parameters associated with each object in the simulation, another node might keep track of positions and velocities of objects within the cluster, another node might control "artificial intelligence" or "AI" objects that are not under participant control, yet another node might be dedicated to computing the results of interactions between objects in the simulation, and so forth. However, this approach can result in highly unequal loads being placed on the nodes of the cluster, as well as requiring massive intercommunication between the nodes. Also, a system using this approach is not easily scaled.

Another approach is to assign separate regions or sectors of the simulated space to separate nodes, so that each node in the cluster provides a full, or nearly full, simulation of all activity within its assigned sector(s). However, it is not uncommon for the objects in a simulation to be unequally distributed throughout the simulated space, so that nothing is happening in many sectors, while there are other sectors where frantic activity is taking place among many objects (e.g. a space battle). This can lead to a highly unequal workload distribution among the nodes of the cluster. Also, this approach can be difficult to scale, unless the size of the simulated space is also expanded.

Figure 1:
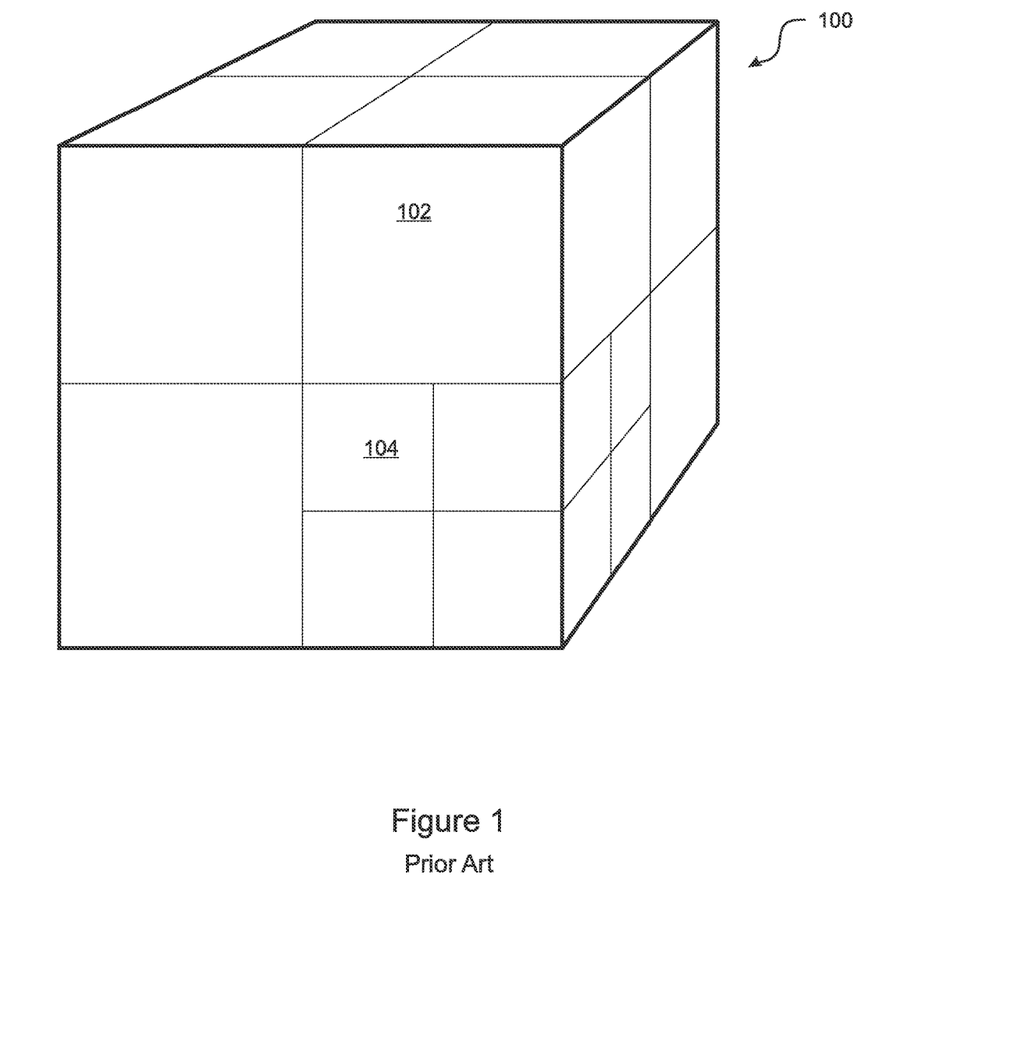
FIG. 1 is a three-dimensional illustration of an octree, as used in the prior art.

Even with very high computing power, it is still important for a simulation engine to adopt an efficient strategy for organizing and managing the simulated space and the simulated objects within the space. One common approach is to divide the simulated space into an "octree," whereby cubes of simulated space are subdivided into groups of eight identical smaller cubes, at least some of which are subdivided into clusters of eight even smaller cubes, and so-forth. This approach is illustrated by FIG. 1, where a large cube 100 of simulated space is divided into eight smaller cubes 102 of equal dimensions. One of these eight cubes is then further divided into eight even smaller cubes 104.

Typically, a cube in the octree is subdivided only when the number of objects in the cube reaches a certain threshold, such as 100 objects in a given cube. For many of these simulations, the objects have finite sizes, and in some cases also specific shapes and orientations. Once the cube is subdivided, objects in the cube will be "dropped" into smaller sub-cubes, and thereby into the next lower level of the tree, only if they do not overlap any sub-cube boundaries. Objects that would overlap a boundary of a sub-cube are retained at the higher level of the tree.

Figure 2:
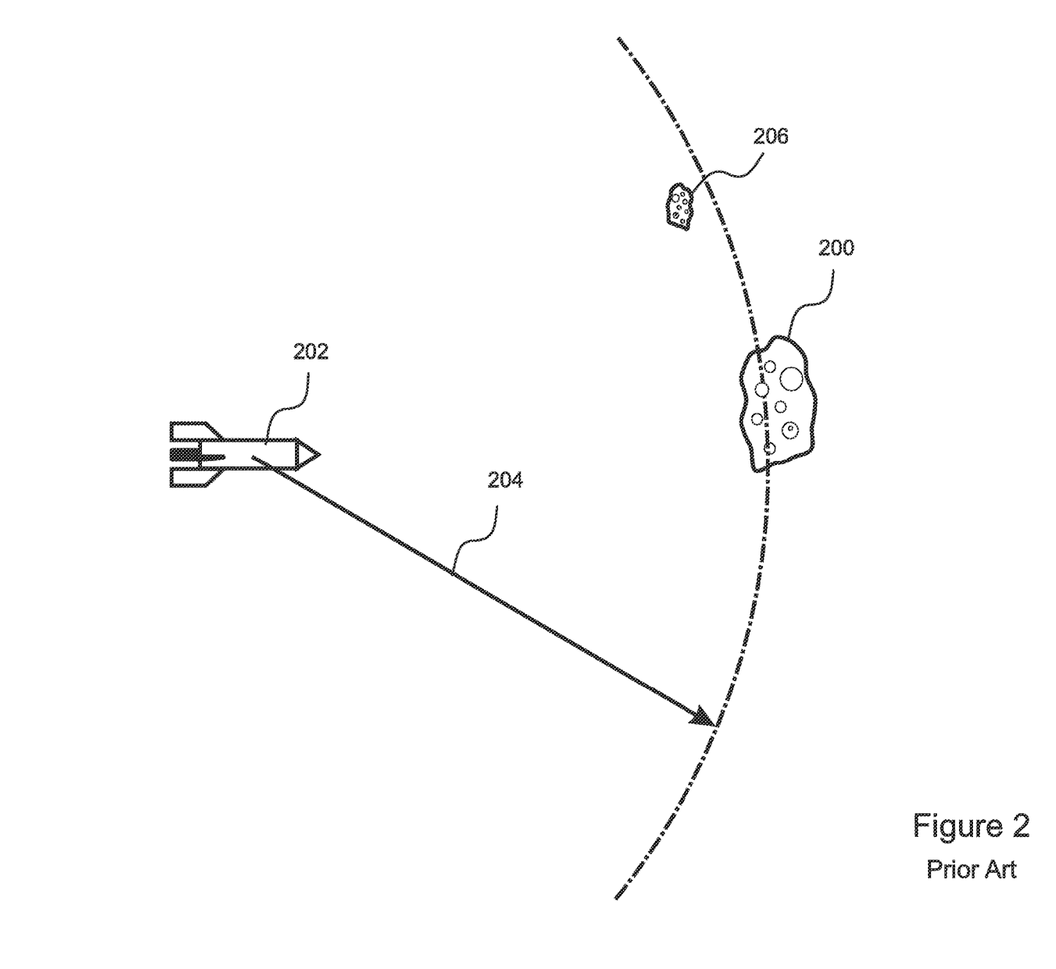
FIG. 2 is a two dimensional illustration of two simulated objects located within or on the visibility sphere of a simulated spacecraft, as is known in the prior art.

In addition to sizes and shapes, simulated objects sometimes also have interaction radii, also called interaction spheres. For example, an object may be able to see other objects only if they are located within a specified visibility radius, also called a visibility "sphere." FIG. 2 presents an example in two dimensions where a simulated asteroid 200 becomes visible to a simulated spaceship 202 only when it crosses within the visibility sphere 204 of the spaceship 202. This approach can be computationally efficient, but it can be problematic to realistically represent the visibility of objects of different sizes. For example, the large asteroid 200 in FIG. 2 may reasonably be visible to the spaceship 202 when it is at the visibility radius 204, however it may not be realistic to also make the much smaller asteroid 206 visible to the spaceship 202 even at a somewhat closer distance. Note that in many implementations, the interaction spheres are actually rectangular or cubical in shape.

Figure 3:
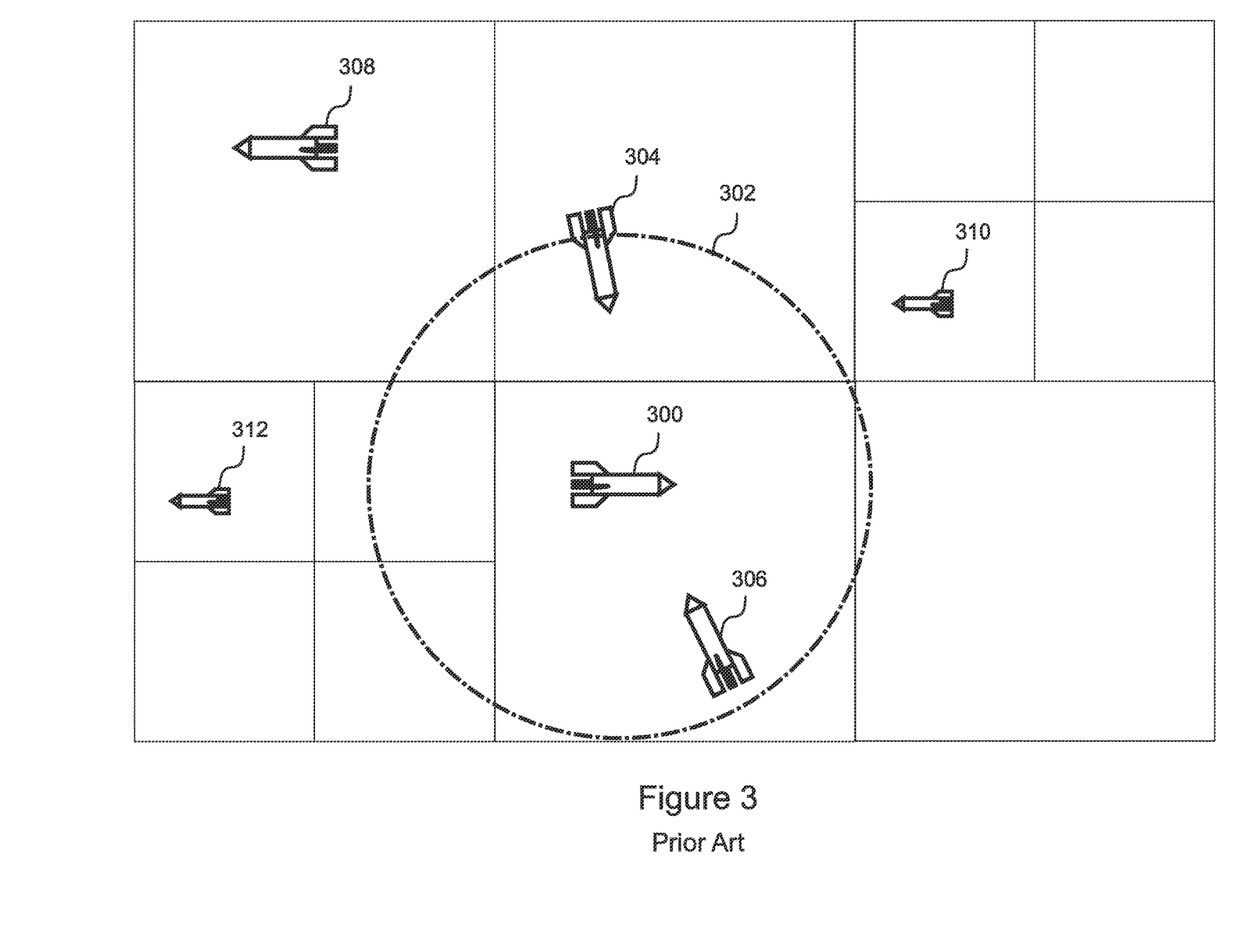
FIG. 3 is a two-dimensional illustration showing how some prior art systems determine which cubes in an octree are overlapped by an interaction sphere.

An important task for a simulation engine is to determine in real time for each simulated object whether there are any other simulated objects located near enough to be visible or otherwise to trigger an interaction of some kind with that object. One approach is to review the locations of all of the objects to determine which if any of the objects is located within an interaction sphere of another object. However, for this approach the number of inter-object distance calculations that must be performed rises as the square of the number of objects. Hence, this approach can be impractical when simulating the interactions of a large number of objects A more efficient approach for large numbers of simulated objects is to divide the task into at least two steps, as illustrated in FIG. 3. For each object 300 in the simulation, the first step is to determine which cubes in the octree are overlapped by the interaction sphere 302 for that object. Then in subsequent steps it is only necessary to consider the distances between the selected object 300 and whatever objects 304, 306 are located in the overlapped cubes.

For example, in the two-dimensional illustration of FIG. 3, which shows a rectangular portion of a larger space, the interaction sphere 302 for object 300 overlaps six squares, including the square inhabited by the selected object 300. Accordingly, objects 304, 306, 308 which are located in overlapped cubes need to be considered in more detail to determine if they are located within the interaction sphere 302 of the selected object 300. Some of them 308 may be "false positives" that are located within an overlapped square but are not located within the interaction sphere 302. Nevertheless, this approach reduces the total number of objects that need to be considered. In this example, objects 310 and 312 are located in non-overlapped spheres (or squares) and need not be considered. The result can be a much lower total number of object comparisons. However, the step of determining which spheres overlap which cubes can be computationally demanding, and can be difficult to support for very large simulations.

What is needed, therefore, is a highly scalable engine for simulating interactions between objects in a space, where the computing workload is efficiently parallelized, interacting objects are quickly and efficiently identified, and the visibility of objects of different sizes is realistically represented.

SUMMARY OF THE INVENTION

The present invention is a highly scalable cluster computing engine for simulating interactions between objects in a simulated space, where interacting objects are quickly and efficiently identified. In embodiments, the visibility of objects of different sizes is realistically represented.

The workload is parallelized among a cluster of computing nodes by distributing the simulated objects among a plurality of nodes in the cluster, so that each of the nodes performs most or all of the calculations required to support the subset of simulated objects assigned to that node. In embodiments, the objects are assigned to the nodes in approximately equal numbers, so that the computing burdens placed upon the nodes in the cluster are approximately equal. In some embodiments, the data traffic between the nodes is minimized by distributing the objects among the nodes in a manner that assigns frequently interacting objects to the same node.

Because the computational requirements of the cluster are parallelized by assigning a subset of the objects to each node, the present invention is easily scaled simply by adding more nodes, and then re-distributing existing and new objects so that all of the nodes have similar computing burdens.

It should be understood that the present invention is applicable to a variety of computational tasks, including simulations, modeling, and virtualizations, all of which are referred to generically herein as "simulations," unless dictated otherwise by the context.

The simulated space is organized according to a unique octree wherein each of the cubes of the octree is surrounded by a "padding" sphere that encloses the entire cube, as well as some "padded" space outside of the cube. The cluster identifies interacting objects quickly and efficiently. As a first step, the cluster engine determines which of the padding spheres are candidate spheres that meet an interaction criterion. Of course, this approach can result in some false positives that would not have resulted if only cubes that met the interaction criterion were considered. Nevertheless, the added computational burden of considering these additional false positives is more than outweighed by the computational savings in determining only the candidate spheres. For example, if the interaction criterion is an interaction sphere, then all that is needed is to determine overlaps of spheres with spheres (i.e. simple distance calculations), rather than overlaps of spheres with cubes or cubes with cubes.

In some embodiments, the cubes are exactly circumscribed by the padding spheres, so that the vertices of the cube are touched by the padding sphere. In some of these embodiments, when a cube is subdivided, objects are "dropped" into the sub-cubes in a manner similar to the prior art criteria described above. In particular, if an object overlaps a boundary of a sub-cube, it is not allowed to drop into the sub-cube regardless of its size, and may be required instead to remain in a cube that is eight times larger than the sub-cube.

In other embodiments, the radii of the padding spheres extend beyond the cube vertices. In some of these embodiments, the padding spheres extend beyond the cube vertices by an amount equal to the largest object that the cube will accommodate, where the maximum object size for any given node in the tree is less than or equal to the size of the node's padding sphere. For example, in various embodiments an object is allowed to drop into a sub-cube only if it is significantly smaller than the sub-cube, for example one-tenth the size of the sub-cube. However, objects meeting this size requirement are allowed to drop into the sub-cube even if they overlap a boundary of the sub-cube. In such cases the padding sphere corresponding to the sub-cube extends beyond the sub-cube vertices by an amount proportional to the size of the largest object that is permitted to be dropped into the corresponding sub-cube. As a result, none of the objects in the sub-cube can extend beyond the padding sphere, even if some of them extend beyond boundaries of the sub-cube. A search for padding spheres that are overlapped by an interaction sphere therefore cannot fail to locate all of the cubes in which a potentially interacting object might be located.

It will be clear to those of skill in the art that searching method described herein using a novel octree with padding spheres is not limited to cluster servers, but can be implemented in computing systems having almost any architecture, including in a simulation hosted by a single computer.

In addition, it will be clear to those of skill in the art that embodiments of the present invention are not limited to searching for intersections spheres, but can include other types of overlaps and intersections. For example, when forming a ray-tracing representation of a view as seen by a selected object, a visibility line is extended from the object and a search is performed to find all objects in the simulated space that are intersected by the visibility line. Embodiments of the present invention search first for all padded spheres that are intersected by the visibility line, and then only consider objects contained in the corresponding octree cubes to find the intersected objects.

It will also be clear to those of skill in the art that the present invention can be used to simulate a two-dimensional, three-dimensional, or in general an N-dimensional space. Accordingly, unless dictated otherwise by the context, the term "cube" is used generically herein to signify a square, a cube, or in general whatever equal-sided, N-dimensional sub-region is applicable to the dimensionality of the space being simulated. Similarly, unless dictated otherwise by the context, the term "octree" is used herein generically to refer to a 4-tree for a two-dimensional simulated space, an 8-tree (i.e. octree) for a three-dimensional simulated space, and in general a $2^N$-tree for an N-dimensional simulated space.

One general aspect of the present invention is a system for hosting a simulation of a plurality of simulated objects interacting within a simulated space. The system includes non-transient media containing software configured for operation on a cluster computing engine, the cluster computing engine including a plurality of computing nodes organized into an intercommunicating cluster, the cluster computing engine being in network communication with a plurality of user access devices. The software is configured to assign the simulated objects to the nodes, so that each of the nodes is responsible for parameter storage and computations in support of the simulated objects that are assigned to it, organize the simulated space into an octree of cubes, each of the cubes being contained within a corresponding padding sphere, and identify all objects that interact with a target object assigned to a host node by causing the nodes to carry out steps including:

communicating by the host node to the other "remote" nodes of a position of the target object and an interaction criterion of the target object;

each of the nodes identifying which padding spheres in their octree are candidate spheres, the candidate spheres being those padding spheres that meet the interaction criterion;

each of the nodes considering candidate objects, the candidate objects being all simulated objects that are located in the cubes that correspond with the candidate spheres;

each of the nodes determining which of the candidate objects meet the interaction criterion;

communicating by the remote nodes to the host node of positions and other details regarding all objects that meet the interaction criterion; and the host node simulating interactions between the target object and the objects that meet the interaction criterion.

In embodiments, the software is further configured to enable a simulation implementer to specify an apportionment of computational workload between the cluster engine and the user access devices, the implementer being able to specify that only command transmission and graphics rendering be apportioned to the user access devices.

In some embodiments, the cubes are circumscribed within the corresponding padding spheres, so that the padding spheres intersect with vertices of the corresponding cubes.

In other embodiments, the padding spheres extend beyond the vertices of the corresponding cubes by an amount that is proportional to a largest object size assigned to the cube, whereby objects that are smaller than the largest object size are permitted to be located in the cube, even if they overlap a boundary of the cube, and objects that are larger than the largest object size are not permitted to be located in the cube.

In various embodiments the software is able to redistribute the simulated objects among the nodes so that frequently interacting objects are assigned to the same node.

In certain embodiments the cluster further includes at least one supporting node to which no simulated objects are assigned.

In some embodiments, the interaction criterion specifies that an object or a padding sphere is deemed to interact with the target object if an only if it intersects with or is contained within an interaction sphere corresponding to the target object, the interaction sphere having an interaction radius.

In some of these embodiments, the target object is surrounded by a plurality of corresponding interaction spheres, each of the interaction spheres representing a different type of interaction, and wherein identifying interactions between the simulated objects includes identifying overlapped padding spheres for the largest of the interaction spheres and determining which candidate objects are located at least partly within the cubes that correspond with the overlapped padding spheres.

In other of these embodiments, the interaction radius of the interaction sphere is scaled by a coefficient that is dependent on a size and distance of a candidate object, so that a candidate object having a candidate size and separated from the target object by a candidate distance is within the target interaction sphere only if the coefficient for the candidate object meets a specified scaled interaction criterion.

And in yet other of these embodiments the interaction sphere is a visibility sphere that indicates a distance within which candidate objects are visible to the target object.

In certain embodiments, the software is further configured to maintain a copy of the octree in each node, subdivision of the cubes in each octree being according to numbers and locations of objects assigned to the corresponding node.

And in various embodiments the simulated objects are assigned to the nodes in approximately equal numbers.

Another general aspect of the present invention is a system for hosting a simulation of a plurality of simulated objects interacting within a simulated space, the system comprising non-transient media containing software configured for operation on a computing system, the computing system being in network communication with a plurality of user access devices. The software is configured to organize the simulated space into an octree of cubes, each of the cubes being contained within a corresponding padding sphere, and identify all objects that interact with a target object assigned to a host node by carrying out steps including:

identifying which padding spheres in the octree are candidate spheres, the candidate spheres being those padding spheres that meet the interaction criterion;

considering candidate objects, the candidate objects being all of the simulated objects that are located in the cubes that correspond with the candidate spheres;

determining which of the candidate objects meet the interaction criterion; and simulating interactions between the target object and the objects that meet the interaction criterion.

In embodiments, the software is further configured to enable a simulation implementer to specify an apportionment of computational workload between the computing system and the user access devices, the implementer being able to specify that only command transmission and graphics rendering be apportioned to the user access devices.

In various embodiments, the cubes are circumscribed within the corresponding padding spheres, so that the padding spheres intersect with vertices of the corresponding cubes.

In some embodiments the padding spheres extend beyond the vertices of the corresponding cubes by an amount that is proportional to a largest object size assigned to the cube, whereby objects that are smaller than the largest object size are permitted to be located in the cube, even if they overlap a boundary of the cube, and objects that are larger than the largest object size are not permitted to be located in the cube.

In some embodiments, the interaction criterion specifies that an object or a padding sphere is deemed to interact with the target object if an only if it intersects with or is contained within an interaction sphere corresponding to the target object, the interaction sphere having an interaction radius.

In some of these embodiments the target object is surrounded by a plurality of corresponding interaction spheres, each of the interaction spheres representing a different type of interaction, and wherein identifying interactions between the simulated objects includes identifying overlapped padding spheres for the largest of the interaction spheres and determining which candidate objects are located at least partly within the cubes that correspond with the overlapped padding spheres.

In other of these embodiment the interaction radius of the target object is scaled by a coefficient that is dependent on a size and distance of a candidate object, so that a candidate object having a candidate size and separated from the target object by a candidate distance is within the target interaction sphere only if the coefficient for the candidate object meets a specified criterion.

And in still other of these embodiments the interaction sphere is a visibility sphere that indicates a distance within which candidate objects are visible to the target object.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present invention is a highly scalable engine for simulating interactions between objects in a space, where the computing workload is efficiently parallelized, and interacting objects are quickly and efficiently identified. The workload is parallelized by distributing the simulated objects among a plurality of nodes in the cluster, so that each of the nodes performs most or all of the calculations required to support the subset of simulated objects assigned to that node. In some embodiments, all of the nodes participate in supporting the objects, while in other embodiments at least one node is reserved for other tasks. For example, certain embodiments include "gateway" nodes through which users gain access to the cluster. Except where otherwise indicated, expressions such as "the nodes" and "all of the nodes" as used herein refer to the nodes which participate in supporting objects.

In embodiments, the objects are assigned to the nodes in approximately equal numbers, so that the computing burdens placed upon the nodes in the cluster are approximately equal. In some embodiments, the assignments are at least initially random. In various embodiments, data traffic between the nodes is minimized by distributing the objects among the nodes in a manner that assigns frequently interacting objects to the same node.

Because the computational requirements in the present invention are parallelized by assigning the objects to nodes, and because the system is able to freely re-distribute the objects among the nodes, the present invention is easily scaled, simply by adding more nodes to the cluster and then re-distributing the existing objects and any new objects so that all of the nodes carry similar computing burdens.

It should be understood that the present invention is applicable to a variety of computational tasks, including simulations, modeling, and virtualizations, all of which are referred to generically herein as "simulations," unless dictated otherwise by the context.

The cluster engine of the present invention identifies interacting objects quickly and efficiently by initially determining only interactions with spheres, which is much less demanding computationally than determining interactions with cubes. The cluster engine of the present invention organizes the simulated space according to a unique octree of padded cubes, wherein each of the cubes in an otherwise conventional octree is surrounded by a "padding" sphere that encloses the entire cube, and in embodiments also encloses some "padded" space outside of the cube. In embodiments, each node maintains its own octree, and determines which cubes in the octree to subdivide and which objects to drop into the sub-cubes according to the locations, sizes, and numbers of objects hosted by that node that are contained within each cube.

Figure 4A:
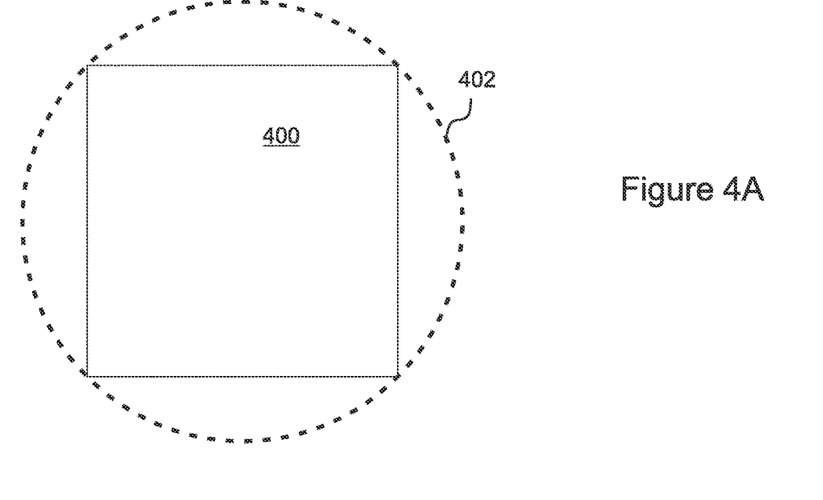
FIG. 4A is a two-dimensional illustration of a cube of an octree circumscribed by a corresponding padding sphere, according to embodiments of the present invention.
Figure 4B:
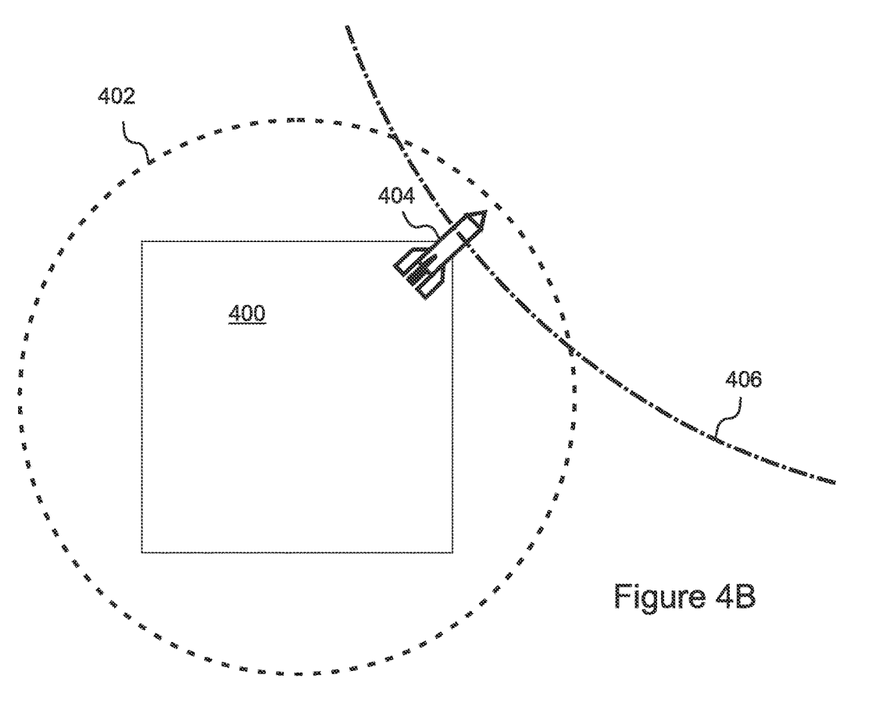
FIG. 4B is a two-dimensional illustration similar to FIG. 4A, except that the padding sphere extends beyond the vertices of the cube, so that an object at the vertex will not extend beyond the sphere.

A 2-dimensional example of a single padded square is presented in FIG. 4A. In this example, the square 400 is exactly circumscribed by its padding circle 402. With reference to FIG. 4B, in some embodiments the padding spheres 402 extend beyond the vertices of the corresponding cubes 400 in proportion to the size of the largest object 404 that is allowed to drop into that cube, so that even if an object 404 is located at a vertex of the cube, it will not extend beyond the padding sphere 402. If the interaction sphere 406 of another object overlaps the object 404 but not the cube 400, the object will not be overlooked, because the initial search will look for padding spheres 402 that are overlapped by the interaction sphere 406, not for cubes 400 that are overlapped by the interaction sphere 406. While the interaction sphere 406 is represented in FIG. 4B as being spherical in shape, note that in many implementations the interaction spheres are actually rectangular or cubical in shape.

Figure 5:
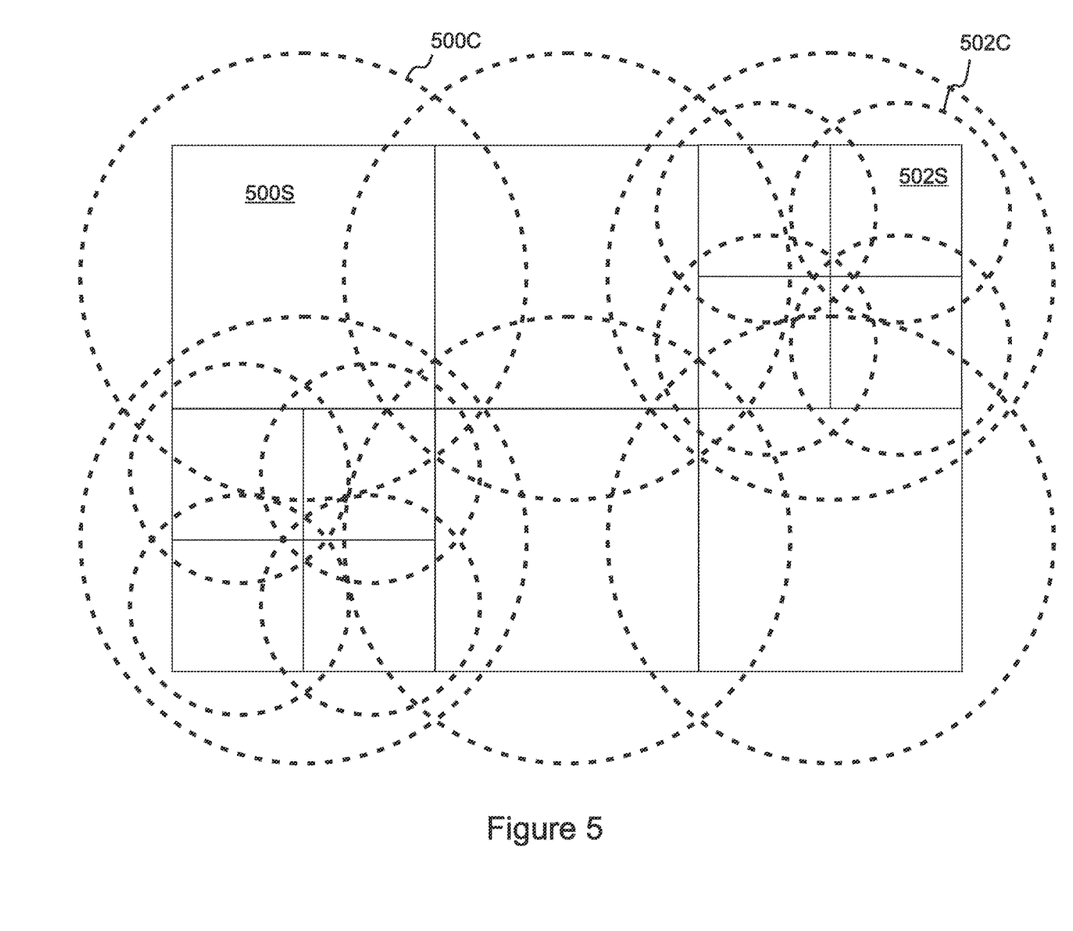
FIG. 5 is a two-dimensional illustration of a plurality of cubes in an octree surrounded by corresponding padding spheres.

FIG. 5 presents a 2-dimensional example of a plurality of padded squares in an embodiment of the present invention. It is clear that the padding spheres 500C, 502C (circles in this 2-dimensional example) extend into adjacent cubes, and that padding spheres 502C for smaller sub-cubes 502S are contained within padding spheres for larger cubes.

Figure 6A:
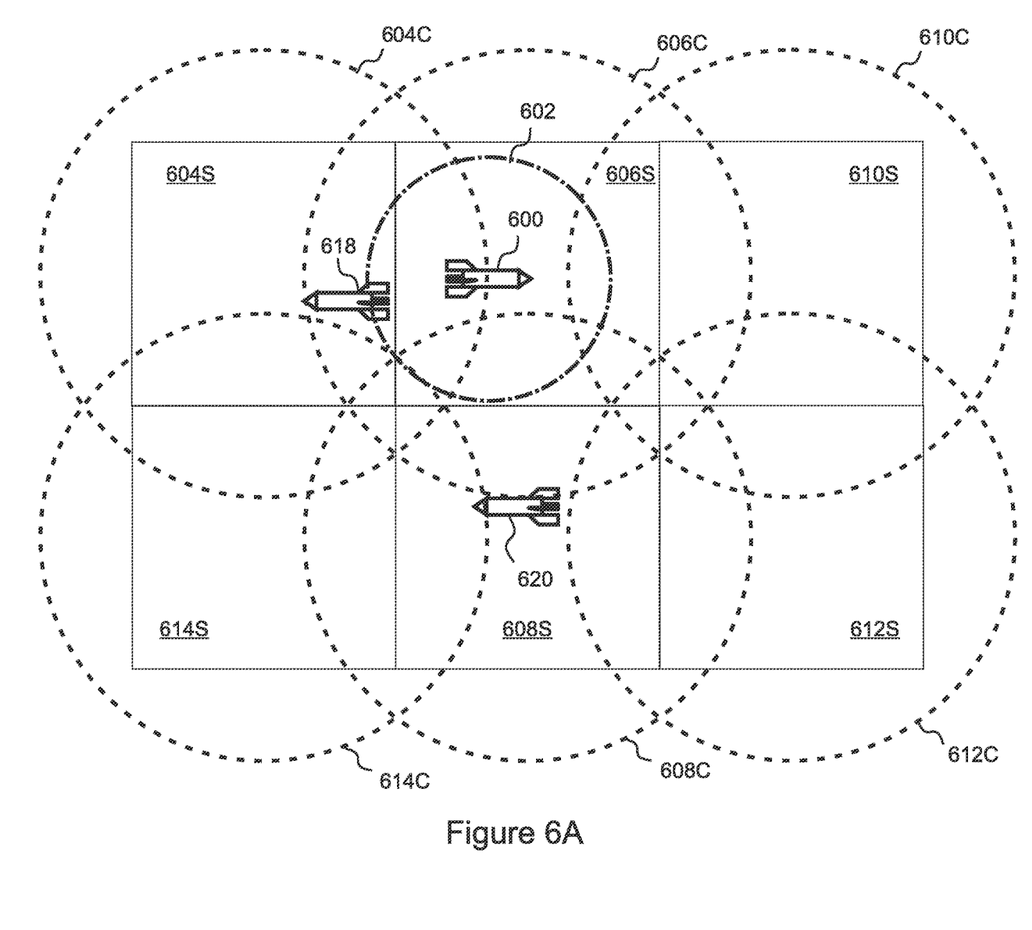
FIG. 6A is a two-dimensional illustration showing how embodiments of the present invention determine which padding spheres in an octree are overlapped by an interaction sphere.

As a first step in identifying object interactions, the host node for a target object reports the location and an interaction criterion, such as an interaction radius of the target object, to the other nodes in the cluster engine. Then all of the nodes, including both the host node and the other nodes, proceed to consult their locally stored octrees to determine which of the padding spheres are candidate spheres that meet the interaction criterion. FIG. 6A presents a 2-dimensional example in which the interaction criterion for a target object 600 is an interaction sphere 602 that surrounds the target object 600. The interaction sphere 602 overlaps the padding circle 606C corresponding to the square 606S in which the selected object 600 resides, as well as two adjacent padding circles 604C, 608C. Accordingly, it is necessary to consider in detail the objects contained in all of the squares 604S, 606S, 608S corresponding to the overlapped padding circles 604C, 606C, and 608C. The object in square 604S is within interaction range of the selected object 600, while the object in square 608S is a "false positive."

Of course, this approach can result in some false positives that would not have resulted if only overlapped cubes were considered. For example, the object in square 608S would not have been examined if only overlapped squares were considered, because the interaction sphere 602 does not overlap square 608S, but only overlaps padded space within padding circle 608C. Nevertheless, the added computational burden of considering these additional false positives is more than outweighed by the computational savings in determining only the overlaps of spheres with spheres (i.e. simple distance calculations), rather than overlaps of spheres with cubes or cubes with cubes.

In general, objects can have more than one interaction sphere, corresponding to more than one type of interaction. In such cases, the overlaps of each interaction sphere with the padding spheres must be determined. For example, a simulated spaceship may have a short range visibility sphere that applies to objects below a certain size, and a long range visibility sphere that applies to objects of a larger size. In such cases, only larger cubes that are overlapped by the long range visibility sphere need be considered.

In some embodiments, a "scaled" visibility sphere can be defined, whereby an object is deemed to be visible to the target object only if it meets a computational requirement dependent on the distance and the size of the object, for example if the ratio of the object's size divided by its distance from the target object is greater than a specified scaling value. A plurality of criteria can be provided that correspond to different visibility levels of detail, so that for example a smaller object may only meet the criteria for being visible as a point, while a larger object at the same distance may meet the criteria for being visible as a shaped object.

Figure 6B:
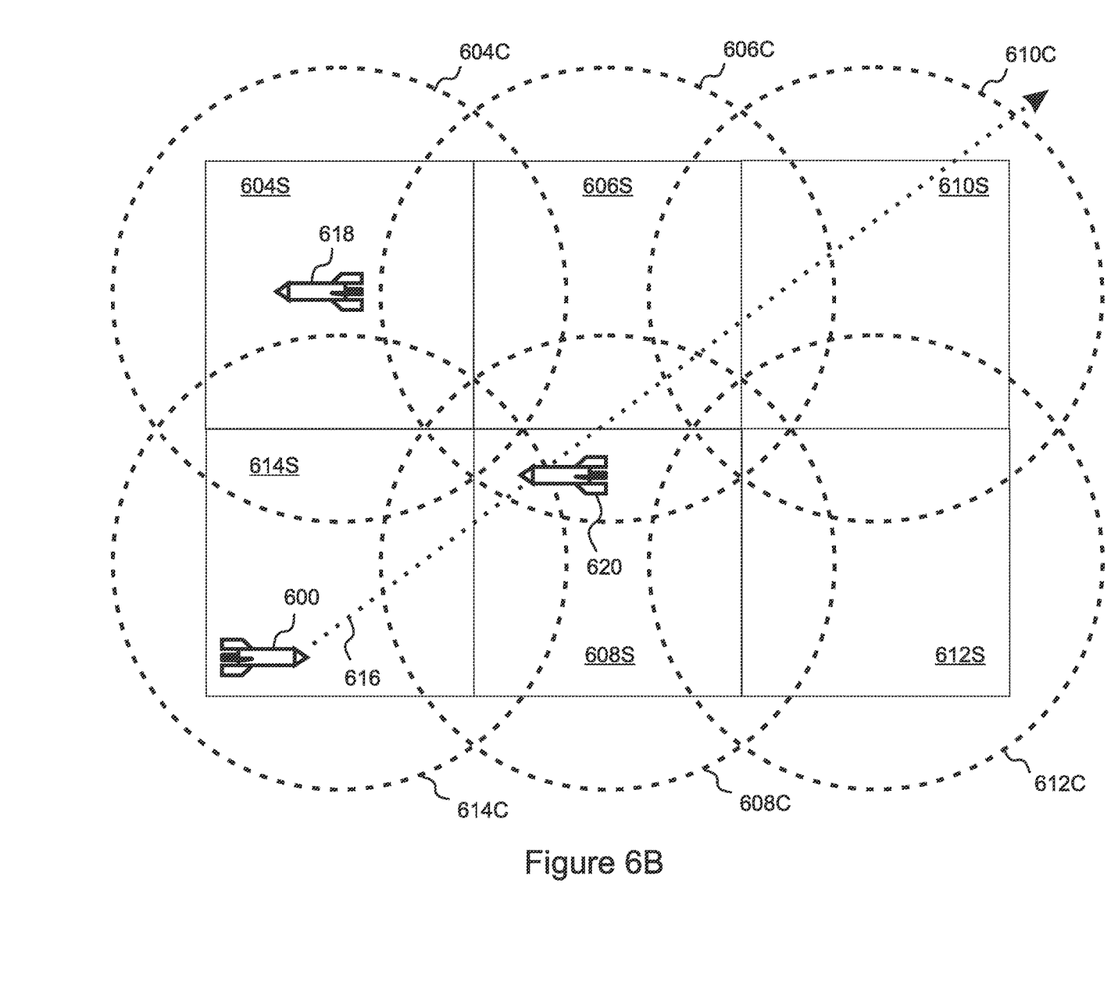
FIG. 6B is a two-dimensional illustration showing how embodiments of the present invention determine which padding spheres in an octree are intersected by a ray-tracing visibility path.

With reference to FIG. 6B, embodiments of the present invention are not limited to searching for intersections between an interaction sphere and padded spheres, but can include other types of overlaps and intersections. For example, in the embodiment of FIG. 6B, when forming a ray-tracing representation of a view as seen by a selected object 600, a visibility line 616 is extended from the object 600 and a search is performed to find all objects in the simulated space that are intersected by the visibility line 616. In the 2D example illustrated in FIG. 6B, the visibility line 616 intersects four padded circles 606C, 608C, 610C, 614C, while at least two other padded circles 604C, 612C are not intersected. Accordingly, only the objects contained in the four squares 606S, 608S, 610S, 614S that correspond to the four intersected padded circles 606C, 608C, 610C, 614C need to be considered. In the example of FIG. 6B, the only such object is item 620 in square 608S. Objects contained in squares corresponding to padded circles that are not intersected by the visibility line 616 are not considered in the search. In the example of FIG. 6B, the only such object is item 618 in square 604S.

Figure 7:
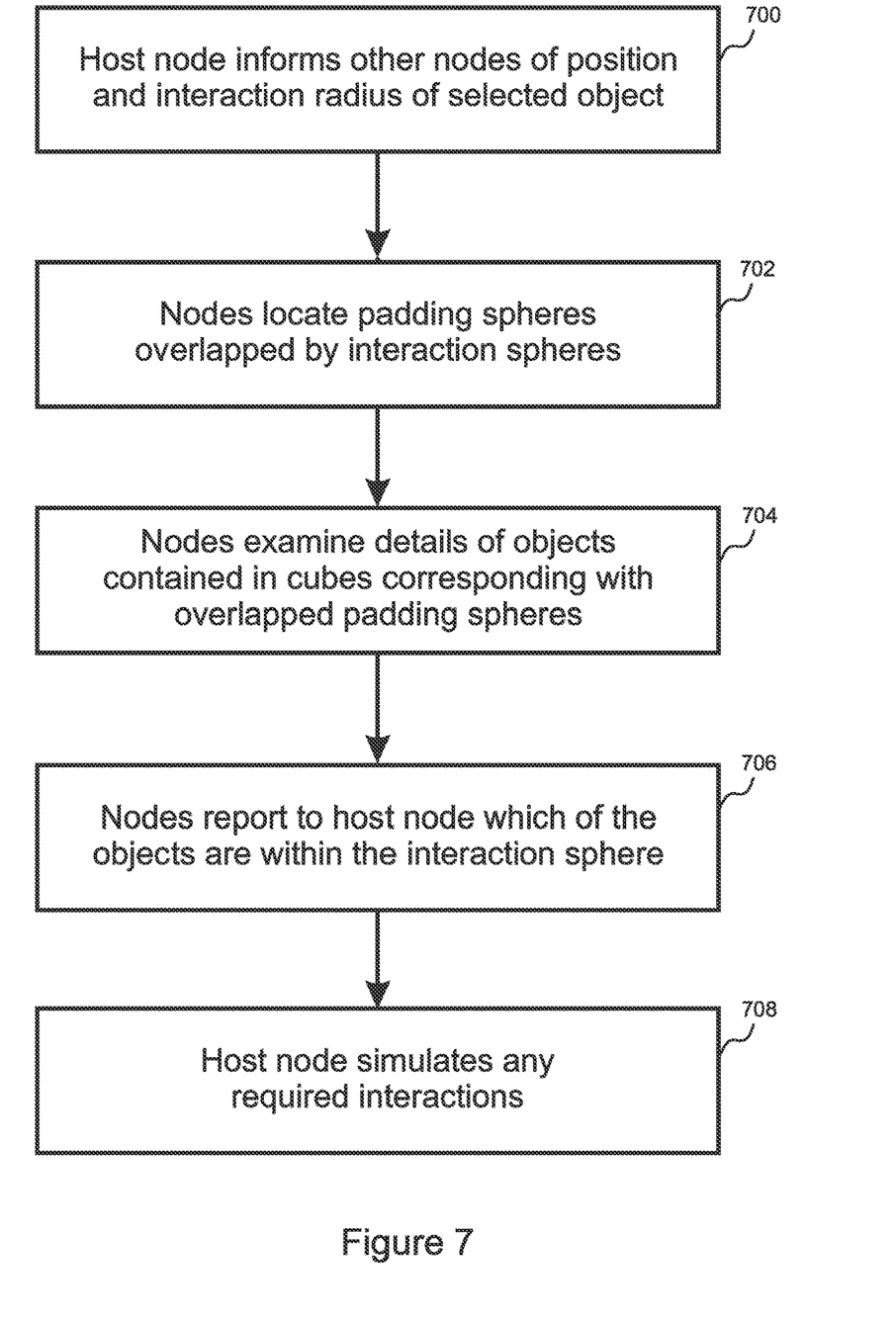
FIG. 7 is a flow diagram illustrating steps followed by embodiments of the present invention to determine which objects in a simulation are interacting with each other.

With reference to FIG. 7, a search for objects that might interact with a target object controlled by a host node begins with the host node informing the remote nodes, which are all of the other nodes, of the position and interaction radius of the target object 700. Typically, the search is initiated by movement or by some other change of the target object. All of the nodes, including the host node and the remote nodes, then consult their locally stored octrees, and determine which padding spheres are overlapped by the interaction sphere of the target object 702. The nodes then consider the objects and/or sub-cubes (thus traversing down the tree) located within the overlapped padding spheres, and determine which objects are within the interaction radius 704. The remote nodes then report back to the host node the locations and other details of all of their objects that are within the interaction sphere of the target object 706. If necessary, the host node then performs the calculations 708 necessary to simulate the indicated interaction(s). If the interaction affects other objects, their host nodes also perform similar calculations.

Object searches can be initiated by any of several criteria, including movement of the target object and/or in some embodiments also other actions or "emotes" performed by the target object. In various embodiments, a search can be initiated based on a target location in the simulated space, even if no object currently occupies that location.

It will be clear to those of skill in the art that searching method described herein using a novel octree with padding spheres is not limited to cluster servers, but can be implemented in computing systems having almost any architecture, including in a simulation hosted by a single computer.

It will also be clear to those of skill in the art that the present invention can be used to simulate a two-dimensional, three-dimensional, or in general an N-dimensional space. Accordingly, unless dictated otherwise by the context, the term "cube" is used generically herein to signify a square, a cube, or in general whatever equal-sided, N-dimensional sub-region is applicable to the dimensionality of the space being simulated. Similarly, unless dictated otherwise by the context, the term "octree" is used herein generically to refer to a 4-tree for a two-dimensional simulated space, an 8-tree (i.e. octree) for a three-dimensional simulated space, and in general a $2^N$-tree for an N-dimensional simulated space.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system providing simulation for objects in a three-dimensional virtual space, comprising:
   a host computing node coupled to a network and executing a simulation engine from a non-transitory storage medium;
   an octree matrix defining the virtual space with adjacent cubes;
   padding spheres defined in the virtual space, one padding sphere fully encasing each cube;
   a plurality of objects defined in the virtual space, each object tracked for position in the virtual space;
   an interaction sphere having an interaction radius uniquely associated with each object in the virtual space, the interaction sphere defining a spherical region around the associated object within which interaction is likely with any other object in the region; and
   at least one display, displaying objects in the virtual space;
   wherein, upon one of the objects becoming a target object by virtue of a change in position or condition, a search is initiated to determine location of any other object within the interaction sphere of the target object, a first step in the search comprising identifying all padding spheres overlapped at least partially by the interaction sphere of the target object as candidate padding spheres, this first step requiring only a distance calculation involving the center locations and radii of the interaction sphere and any one of the candidate padding spheres, the needed calculation being a less computer-intensive calculation than an alternative of calculating overlap of an interaction sphere with a cube in the absence of the padding sphere encompassing the cube, thereby enabling faster computing times, and updates are made for changes in position for the target object as a result of the search, data is streamed to the at least one display, enabling display of the new target object position in relation to position of the other objects.

2. The system of claim 1, wherein the use of padding spheres allows the objects including the target object to be considered to be within a cube even when partially extending beyond the cube.

3. The system of claim 1, wherein individual ones of the padding spheres are defined with a center and a radius such that all vertices of the associated cube lie on the spherical surface of the padding sphere, or the center stays the same and the radius is increased such that all vertices of the cube are within the volume of the padding sphere.

4. The system of claim 1, wherein the interaction sphere is a visibility sphere that indicates a distance within which the other objects are rendered visible in simulation to the target object.

5. The system of claim 1 further comprising a plurality of computing nodes coupled to the network in a cluster, each of the computing nodes maintaining a copy of the octree and the padding spheres associated with individual cubes in the octree, wherein individual objects or sets of objects in the virtual space are exclusively assigned for computation by the host computing node to individual ones of the computing nodes thereby enabling communication of less data between the nodes and the host computing node.

6. The system of claim 5 wherein upon one object becoming a target object by virtue of a change in position or condition, the search is initiated and performed by the computing node to which the target object has been assigned, and results of the search are communicated back to the host computing node to perform updates to object positions and conditions through execution of the simulation engine at the host computing node, the performance of the searches by the computing nodes providing a further improvement in computing load for the simulation.

7. The system of claim 5 wherein objects for computation are evenly distributed among the computing nodes, such that computing burden among the nodes is approximately equal.

8. The system of claim 5 wherein interacting objects causing data traffic among the nodes are assigned to one node, minimizing communication among nodes.

9. The system of claim 5 wherein the system is scaled by adding nodes to the cluster and redistributing objects to the nodes.

10. A method providing simulation for objects in a three-dimensional virtual space, comprising:
   (a) imposing an octree matrix defining the virtual space with adjacent cubes;
   (b) associating a padding sphere having a radius with each cube of the octree, each padding sphere fully encasing the associated cube;
   (c) associating an interaction sphere having an interaction radius with individual objects in the virtual space, the interaction sphere for an object defining a spherical region around the object within which interaction is likely with any other object in the region;
   (d) considering one object in the virtual space as a target object by virtue of a change in position or condition;
   (e) initiating a search to determine location of other objects within the interaction sphere of the target object, a first step in the search comprising identifying any and all padding spheres overlapped at least partially by the interaction sphere of the target object as candidate padding spheres, this first step requiring only a distance calculation involving the center locations and radii of the interaction sphere and any candidate padding sphere, the needed calculation being a less computer-intensive calculation than an alternative of calculating overlap of an interaction sphere with a cube in the absence of the padding sphere encompassing the cube, thereby enabling faster computing times; and upon any object determining a new position as a result of input or interaction with one or more of the other objects, a data update occurs, and new data is streamed to at least one display, the display then displaying updated object positions.

11. The method of claim 10, wherein the use of padding spheres allows the target object and other objects to be considered to be within a cube even when partially extending beyond the cube.

12. The method of claim 10, wherein individual ones of the padding spheres are defined with a center and a radius such that all vertices of the associated cube lie on the spherical surface of the padding sphere, or the center stays the same and the radius is increased such that all vertices of the cube are within the volume of the padding sphere.

13. The method of claim 10, wherein the interaction sphere is a visibility sphere that indicates a distance within which the other objects are rendered visible in simulation to the target object.

14. The method of claim 10 further comprising a plurality of computing nodes coupled to the network in a cluster, each of the computing nodes maintaining a copy of the octree and the padding spheres associated with individual cubes in the octree, wherein individual objects or sets of objects in the virtual space are exclusively assigned for computation by the host computing node to individual ones of the computing nodes.

15. The method of claim 14 wherein upon one object becoming a target object by virtue of a change in position or condition, the search is initiated and performed by the computing node to which the target object has been assigned, and results of the search are communicated back to the host computing node to perform updates to object positions and conditions through execution of the simulation engine at the host computing node, the performance of the searches by the computing nodes providing a further improvement in computing load for the simulation.

16. The method of claim 14 wherein objects for computation are evenly distributed among the computing nodes, such that computing burden among the nodes is approximately equal.

17. The method of claim 14 wherein interacting objects causing data traffic among the nodes are assigned to one node, minimizing communication among nodes.

18. The method of claim 14 wherein the system is scaled by adding nodes to the cluster and redistributing objects to the nodes.

* * * * *